(12) United States Patent
Lung et al.

(10) Patent No.: US 9,972,660 B2
(45) Date of Patent: May 15, 2018

(54) 3D PHASE CHANGE MEMORY WITH HIGH ENDURANCE

(71) Applicants: MACRONIX INTERNATIONAL CO., LTD., Hsinchu (TW); INTERNATIONAL BUSINESS MACHINES CORPORATION, Armonk, NY (US)

(72) Inventors: Hsiang-Lan Lung, Ardsley, NY (US); Wanki Kim, White Plains, NY (US); Matthew J. Brightsky, Pound Ridge, NY (US); Chung Hon Lam, Peekskill, NY (US)

(73) Assignees: MACRONIX INTERNATIONAL CO., LTD., Hsinchu (TW); INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days. days.

(21) Appl. No.: 15/703,873

(22) Filed: Sep. 13, 2017

(65) Prior Publication Data

US 2018/0012938 A1 Jan. 11, 2018

Related U.S. Application Data

(63) Continuation of application No. 15/207,022, filed on Jul. 11, 2016, now Pat. No. 9,793,323.

(51) Int. Cl.
*H01L 27/24* (2006.01)
*H01L 45/00* (2006.01)

(52) U.S. Cl.
CPC .......... *H01L 27/2481* (2013.01); *H01L 45/06* (2013.01); *H01L 45/1233* (2013.01); *H01L 45/141* (2013.01); *H01L 45/144* (2013.01); *H01L 45/1608* (2013.01)

(58) Field of Classification Search
CPC combination set(s) only.
See application file for complete search history.

(56) References Cited

U.S. PATENT DOCUMENTS

| | | |
|---|---|---|
| 5,389,566 A | 2/1995 | Lage |
| 5,694,146 A | 12/1997 | Ovshinsky et al. |
| 5,751,012 A | 5/1998 | Wolstenholme et al. |
| 6,507,061 B1 | 1/2003 | Hudgens et al. |

(Continued)

OTHER PUBLICATIONS

Czubatyj, et al. "Invited Paper: Thin-Film Ovonic Threshold Switch: Its Operation and Application in Modem Integrated circuits," Electron. Mater. Lett.vol. 8, No. 2, Apr. 29, 2012, 11 pages.

(Continued)

*Primary Examiner* — Ratisha Mehta
(74) *Attorney, Agent, or Firm* — Haynes Beffel & Wolfeld LLP

(57) ABSTRACT

A plurality of memory cells in a 3D cross-point array with improved endurance is disclosed. Each memory cell, disposed between first and second conductors, includes a switch in series with a pillar of phase change material. The pillar has a Te-rich material at one end proximal to the second conductor, and an Sb-rich material at the other end proximal to the first conductor, wherein the current direction is from the first conductor to the second conductor.

20 Claims, 12 Drawing Sheets

(56) References Cited

U.S. PATENT DOCUMENTS

| | | |
|---|---|---|
| 6,555,858 B1 | 4/2003 | Jones et al. |
| 6,579,760 B1 | 6/2003 | Lung |
| 6,795,338 B2 | 9/2004 | Parkinson et al. |
| 6,897,467 B2 | 5/2005 | Doan et al. |
| 7,018,911 B2 | 3/2006 | Lee et al. |
| 7,236,394 B2 | 6/2007 | Chen et al. |
| 7,391,045 B2 | 6/2008 | Lowrey |
| 7,394,089 B2 | 7/2008 | Doyle et al. |
| 7,485,891 B2 | 2/2009 | Hamann et al. |
| 7,504,653 B2 | 3/2009 | Lung |
| 7,560,337 B2 | 7/2009 | Ho et al. |
| 7,579,613 B2 | 8/2009 | Lung et al. |
| 7,606,059 B2 | 10/2009 | Toda |
| 7,623,370 B2 | 11/2009 | Toda et al. |
| 7,778,063 B2 | 8/2010 | Brubaker et al. |
| 7,868,313 B2 | 1/2011 | Breitwisch et al. |
| 8,605,495 B2 | 12/2013 | Lung |
| 9,793,323 B1 | 10/2017 | Lung et al. |
| 2002/0042158 A1 | 4/2002 | Kersch et al. |
| 2003/0003647 A1 | 1/2003 | Dennison et al. |
| 2003/0215978 A1 | 11/2003 | Maimon et al. |
| 2004/0026686 A1 | 2/2004 | Lung |
| 2004/0114317 A1 | 6/2004 | Chiang et al. |
| 2005/0019975 A1 | 1/2005 | Lee et al. |
| 2005/0127347 A1 | 6/2005 | Choi et al. |
| 2006/0001174 A1 | 1/2006 | Matsui |
| 2006/0003263 A1 | 1/2006 | Chang |
| 2006/0077741 A1 | 4/2006 | Wang et al. |
| 2006/0110878 A1 | 5/2006 | Lung et al. |
| 2006/0175596 A1 | 8/2006 | Happ et al. |
| 2007/0045605 A1 | 3/2007 | Hsueh |
| 2007/0045606 A1 | 3/2007 | Magistretti et al. |
| 2008/0116441 A1 | 5/2008 | Raghuram et al. |
| 2009/0148980 A1 | 6/2009 | Yu |
| 2009/0298223 A1 | 12/2009 | Cheek et al. |
| 2010/0193763 A1 | 8/2010 | Chen et al. |
| 2010/0291747 A1 | 11/2010 | Lung et al. |
| 2011/0034003 A1 | 2/2011 | Lung |
| 2011/0121253 A1 | 5/2011 | Lung |
| 2012/0193595 A1* | 8/2012 | Cheng ................ C23C 14/0623 257/2 |
| 2016/0012889 A1* | 1/2016 | Shepard ............ G11C 13/0069 365/163 |

OTHER PUBLICATIONS

Kau, et al., "A stackable cross point phase change memory," 2009 International Electron Devices Meeting, Baltimore MD, Dec. 7-9, 2009, pp. 27.1.1-27.1.4.

Li et al., "Evaluation of SiO2 Antifuse in a 3D-OTP Memory," IEEE Transaction on Device and Materials Reliability, vol. 4, No. 3, Sep. 2004, 6 pages.

Sasago, et al., "Cross-point phase change memory with 4F2 cell size driven by low-contact-resistivity poly-Si diode," 2009 Symp. on VLSI Technology, Jun. 16-18, 2009, 2 pages.

Shin, et al., "The effect of doping Sb on the electronic structure and the device characteristics of Ovonic Threshold Switches based on Ge—Se," Scientific Reports, 4:7099, Nov. 18, 2014, 5 pages.

Wang et al., "A Model for cyanic threshold switch of amorphous GST based on hopping transport process," 2010 IEEE Int'l Conf. of Electron Devices and Solid-State Circuits (EDSSC), Dec. 15-17, 2010, Hong Kong, pp. 1-4.

* cited by examiner

3D PHASE CHANGE MEMORY WITH HIGH ENDURANCE

RELATED APPLICATIONS

This application is a continuation of application Ser. No. 15/207,022, filed on 11 Jul. 2016 (now U.S. Pat. No. 9,793,323), which application is incorporated herein by reference.

PARTIES TO A JOINT RESEARCH AGREEMENT

International Business Machines Corporation, a New York corporation, and Macronix International Corporation, Ltd., a Taiwan corporation, are parties to a Joint Research Agreement.

BACKGROUND

Technical Field

This technology relates to integrated circuit memory technologies, including technologies using phase change materials and methods for manufacturing such devices.

DESCRIPTION OF RELATED ART

Many three dimensional (3D) memory technologies using phase change material, and other programmable resistance materials have been proposed. For example, Li et al., "Evaluation of $SiO_2$ Antifuse in a 3D-OTP Memory," IEEE Transactions on Device and Materials Reliability, Vol. 4, No. 3, September 2004, describes a polysilicon diode and an anti-fuse arranged as a memory cell. Sasago et al., "Cross-Point Phase Change Memory with $4F^2$ Cell Size Driven by Low-Contact-Resistivity Poly-Si Diode," 2009 Symposium on VLSI Technology Digest of Technical Papers, pages 24-25, describes a polysilicon diode and a phase change element arranged as a memory cell. Kau et al., "A Stackable Cross Point Phase Change Memory," IEDM09-617, (2009) pages 27.1.1 to 27.1.4, describes a memory post including an ovonic threshold switch OTS as an access device with a phase change element.

One problem associated with memory based on phase change materials has been failure of memory cells after extended use, which is characterized as limited endurance. Phase change materials are relatively complex, and can fail due to segregation of the materials in the memory cells. Segregation of the materials can interfere with the phase change mechanism, making the memory cell hard to reset or hard to set. Also, segregation can cause short circuits through the memory cells.

In addition, the phase change materials can be subjected to void formation at electrode surfaces and elsewhere in the body of the materials. As voids develop and merge with each other in the active region, they can interfere with current flow or cause an open circuit condition blocking current flow altogether.

Therefore, it is desirable to provide a memory that is suitable for high density structures, better data retention and longer endurance.

SUMMARY

A phase change memory cell is described which has improved endurance. Also, phase change memory cells arranged in a 3D cross-point configuration are described.

In embodiments described herein, a phase change memory cell can include a switch, or steering device, in series with a stack of materials, including a body of phase change material, a first buffer layer and a second buffer layer. The compositions of first and second buffer layers are different, particularly in regard to elements of the phase change material. The switch can be an ovonic threshold switch in embodiments described herein.

One aspect of the technology includes a cross-point memory, having a plurality of first conductors in a first patterned layer and a plurality of second conductors in a second patterned layer; and an array of memory cells disposed between the first conductors and the second conductors. Each memory cell in the array comprises a switch in series with a pillar including the phase change material. The pillar comprises a first side electrically connected to the switch and a second side electrically connected to one of the first and second conductors. The phase change material in the pillar has an active region which changes solid phases during operation of the memory.

As described herein, the phase change material between the first and second buffer layers comprises a multi-element material like ternary or quaternary chalcogenides (e.g., $Ge_xSb_yTe_z$, $Ga_xSb_yTe_z$, $Ga_wGe_xSb_yTe_z$). Also, the phase change material can have a dielectric additive, for example silicon oxide. A first buffer layer having a concentration of a first element of the phase change material between the active region and the switch, and a second buffer layer having a concentration of a different second element between the active region and the one of the first and second conductors are provided. The first and second elements can be antimony Sb and tellurium Te, for example. The concentration of the first element in the first buffer layer is higher than a concentration of the first element in the second buffer layer. The concentration of the second element in the second buffer layer is higher than the concentration of the second element in the first buffer layer. The buffer layers that are different in regard to the first and second elements suppress segregation and void formation in the active region over the life of the memory. It is believed that the buffer layers act conceptually at least as sinks or sources of the first and second elements of the phase change material, and tend to equilibrate mass flow dynamics during operation of the memory.

The first buffer layer can include a higher concentration of the first element than the active region of the phase change material, and the second buffer layer includes a higher concentration of the second element than the active region.

The phase change material in the pillar can be physically confined in the lateral direction by a dielectric fill material between the first and second patterned layers of conductors.

Another aspect of the technology is a method of manufacturing an integrated circuit including a memory cell like that described above.

Other features, aspects and advantages of the technology described herein can be understood with reference to the figures, the detailed description and the claims set out below.

BRIEF DESCRIPTION OF THE DRAWINGS

FIG. 12 is a block diagram of an integrated circuit with a 3D memory array having an interlayer insulating structure as described in.

DETAILED DESCRIPTION

Detailed descriptions of embodiments of programmable resistance memory devices and of methods of manufacturing such devices are provided with reference to FIGS. 1-12.

Figure 1:
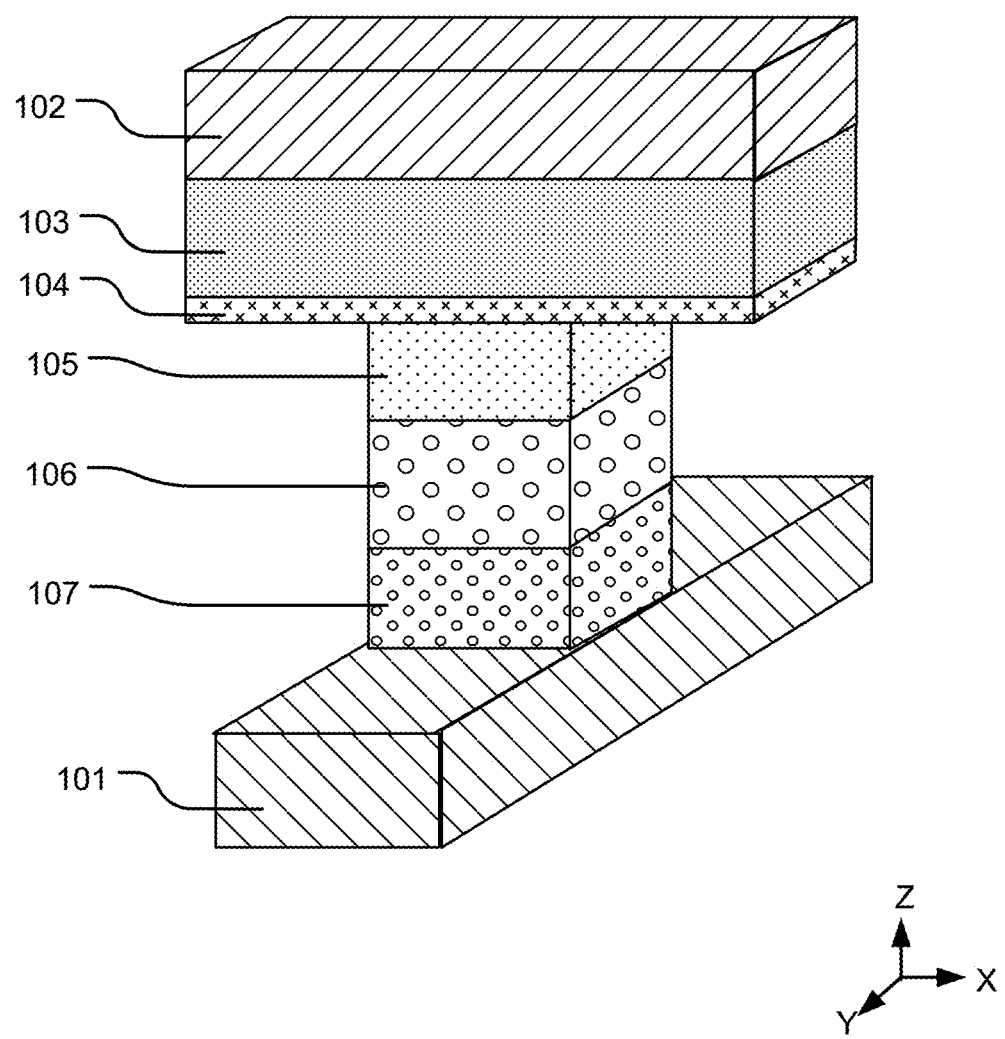
FIG. 1 is a perspective view of a memory cell in a cross-point array.

FIG. 1 is a perspective view of a phase change memory cell suitable for use in a cross-point array. A first conductor 101 can be configured as a bit line, and a second conductor 102 can be configured as a word line. A memory cell is disposed between first conductor 101 and second conductor 102 and comprises a switch in series with a pillar including phase change material. The switch comprises an ovonic threshold switching layer 103 and a diffusion barrier 104, which in this embodiment are disposed in a pattern lining the underside of the second conductor 102. The pillar has a first side in contact for current flow connection with diffusion barrier 104 of the switch and a second side in contact for current flow connection with first conductor 101.

In another example, the switch and pillar are inverted, so that the second side of the pillar is in contact with second conductor 102 and switching layer 103 is in contact with first conductor 101.

The body 106 of phase change material includes first and second elements and is confined by a dielectric fill material (not shown) between first conductor 101 and second conductor 102.

The phase change material can comprise chalcogenide-based materials, for example $Ga_xSb_yTe_z$, $Ge_xSb_yTe_z$, $Ga_wGe_xSb_yTe_z$, $Ge_wGe_xSb_yTe_z$, $Ag_wIn_xSb_yTe_z$, $Sn_wGe_xSb_yTe_z$, $Se_wGe_xSb_yTe$, and $S_wGe_xSb_yTe_z$. The phase change material comprises the first element, for example tellurium (Te), and the second element, for example antimony (Sb). The phase change material can have additives, for example nitrogen, silicon, oxygen, silicon oxide, and silicon nitride. In one embodiment, the phase change material is $Ge_xSb_yTe_z$, with a silicon oxide additive, the first element is Te and the second element is Sb.

An active region in the body 106 of phase change material in the pillar changes phases during set and reset operations of the array. Typically, after a manufacturing process, and before any programming, the phase change material is in a crystalline or low resistance state. During operation or testing, the active region may be reset into an amorphous or high resistance state or set into a crystalline or low resistance state. In some embodiments, the multiple programmable resistance states can be invoked to store data, including one or more amorphous states at different resistance levels, for example, corresponding to different amounts of the amorphous phase material.

The pillar comprises a first buffer layer 105 comprising the first element, disposed at the first side between the switch and body 106 of phase change material. The first buffer layer can provide a source and/or a sink of the first element, such as by having a higher concentration of the first element than the active region. The pillar further comprises a second buffer layer 107 comprising the second element, disposed at the opposing second side, and connected for current flow with first conductor 101. The second buffer layer can provide a source and/or a sink of the second element, such as by having a higher concentration of the second element than the active region.

In an implementation using a chalcogenide like $Ga_xSb_yTe_z$, $Ge_xSb_yTe_z$, or $Ga_wGe_xSb_yTe_z$, or other material including Te and Sb as the phase change material in the body 106, and in which the primary current flow during operation is from first conductor 101 (positive node) to second conductor 102 (negative node), the first element is Te and first buffer layer 105 can comprise a Te-rich phase change material; the second element is Sb and second buffer layer 107 comprises an Sb-rich phase change material. If the primary current flow is from second conductor 102 (positive node) to first conductor 101 (negative node), for these embodiments the first element is Sb and first buffer layer 105 comprises an Sb-rich phase change material, and the second element is Te and second buffer layer 107 can comprise a Te-rich phase change material.

Switching layer 103 can comprise a chalcogenide combination selected for operation as an ovonic threshold switch, and can include one or more elements selected from the group comprising arsenic (As), tellurium (Te), antimony (Sb), selenium (Se), germanium (Ge), silicon (Si), oxygen (O) and nitrogen (N). In one example, switching layer 103 can have a thickness of about 10 nm to about 40 nm, preferably about 30 nm. Czubatyj et al., "Thin-Film Ovonic Threshold Switch: Its Operation and Application in Modern Integrated Circuits," Electronic Materials Letters, Vol. 8, No. 2 (2012), pages 157-167, describes applications and electrical characteristics of the thin-film Ovonic Threshold Switch (OTS). In other embodiments, other current steering devices can be utilized, including diodes, transistors, tunneling dielectric layers and so on.

Diffusion barrier 104 comprises a material or combination of materials selected to provide adequate adhesion between switching layer 103 and the pillar including phase change material, and blocks movement of impurities from the pillar into the switch and vice versa. The diffusion barrier can be comprised of conductive material with a thickness of about 3 to about 30 nm, preferably about 5 nm. Appropriate materials for diffusion barrier 104 may comprise a metal nitride, for example, titanium nitride (TiN), tantalum nitride (TaN), tungsten nitride (WN), molybdenum nitride (MoN), titanium silicon nitride (TiSiN), titanium aluminum nitride (TiAlN). In addition to metal nitrides, conductive materials, such as titanium carbide (TiC), tungsten carbide (WC), graphite (C), titanium (Ti), molybdenum (Mo), tantalum (Ta), titanium silicide (TiSi), tantalum silicide (TaSi), and titanium tungsten (TiW), can be used for diffusion barrier 104.

The materials chosen for first conductor 101 and second conductor 102 can comprise a variety of metals, metal-like materials and doped semiconductors, and combinations thereof. First conductor 101 and second conductor 102 can be implemented using one or more layers of materials like tungsten (W), aluminum (Al), copper (Cu), titanium nitride (TiN), tantalum nitride (TaN), tungsten nitride (WN), doped polysilicon, cobalt silicide (CoSi), Tungsten silicide (WSi) and other materials.

Figure 2:
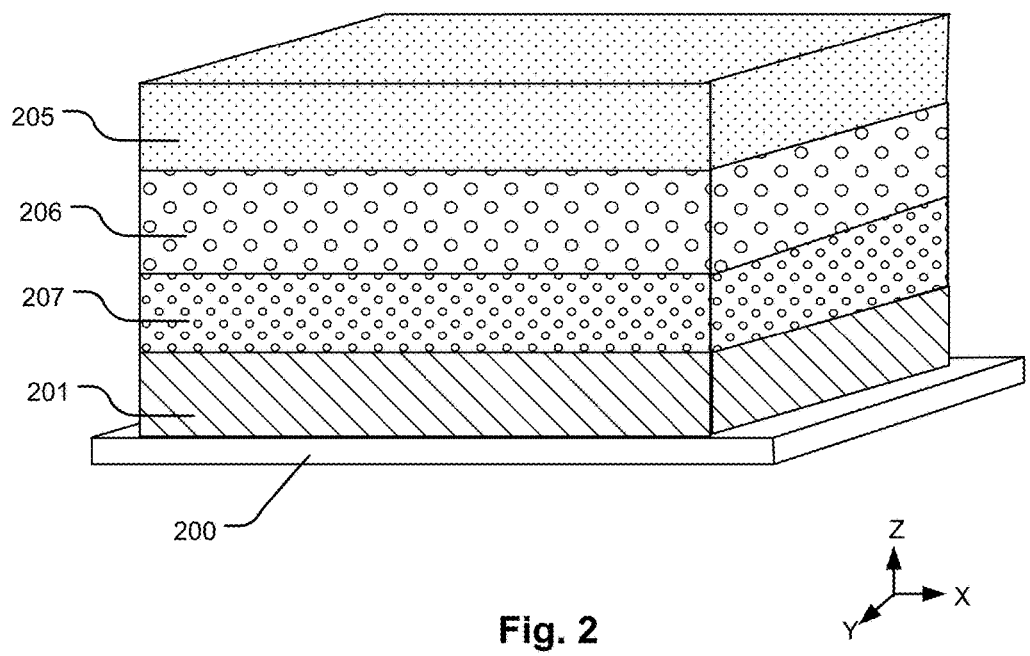
FIGS. 2-10 illustrate stages of an example process flow for a memory array.

FIGS. 2 through 10 illustrate stages of an example process flow for manufacturing an array of memory cells described. Reference numerals used in FIG. 2 are generally applied in the following figures and not described again.

FIG. 2 illustrates a stage of the process flow after forming a plurality of layers. To form the structure shown in FIG. 2, a layer 201 of conductive material suitable for bit lines is deposited over a substrate 200, followed by depositing a layer 207 of material suitable for the second buffer layer, a layer 206 of phase change material suitable for the active region, and a layer 205 of material suitable for the first buffer layer. The second buffer layer 207 can comprise phase change material rich in the second element compared to the phase change layer 206. The first buffer layer 205 can comprise phase change material rich in the first element compared to the phase change layer 206. Also, the second buffer layer 207 can have a higher concentration of the second element than the first buffer layer 205, and the layer 205 can have a higher concentration of the first element than the layer 207.

In embodiments in which the layers 205, 206 and 207 comprise phase change material, the layers can be deposited by physical vapor deposition (PVD), sputtering, or a magnetron-sputtering method with source gas(es) of Ar, $N_2$, and/or He, etc. at the pressure of 1 mTorr~100 mTorr, for example. The bias applied to the sputter targets can be controlled during the sputtering process to control the relative concentrations of the elements in the multi-element material, to establish the distributions described herein. Alternatively, the layers also can be formed using chemical vapor deposition (CVD) and atomic layer deposition (ALD).

Additives can be included in the layers of phase change material by sputtering, or by other methods. Thus, the phase change material comprises a chalcogenide or a chalcogenide with one or more additives selected from a group including silicon, oxygen, nitrogen, carbon and dielectrics. Each of the layers (e.g. 207, 206, and 205) of phase change material can have a thickness ranging from about 10 nm to 50 nm.

In another embodiment, the layers 205, 206 and 207 can comprise phase change material being composed of different elements. For example, first and second buffer layers 205, 207 comprise the $Ga_xSb_yTe_z$ family material and phase change layer 206 comprises the $Ge_xSb_yTe_z$ family material, or other chalcogenide-based materials comprising Te and Sb elements.

In other embodiments, first buffer layer 205 can be formed by depositing a material that is not a phase change material, for example a thin layer of the first element, on the order of a few nanometers thick. In other embodiments, second buffer layer 207 can be formed by depositing a material that is not a phase change material, for example a thin layer of the second element, on the order of a few nanometers thick.

Figure 3:
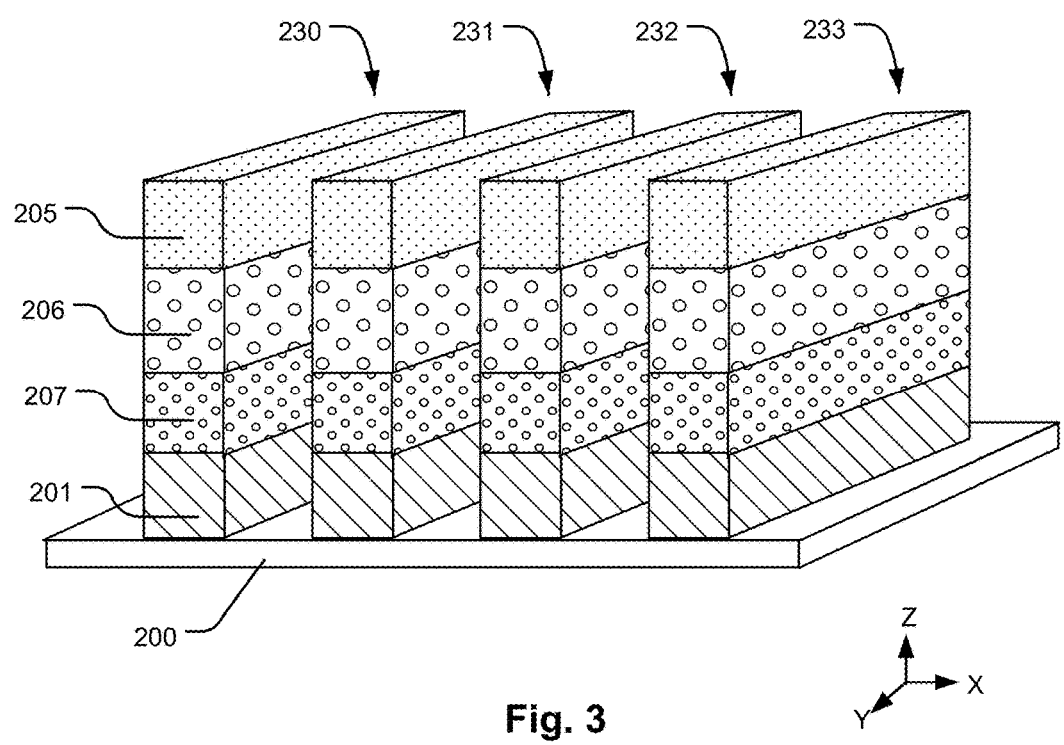

FIG. 3 illustrates a stage of the process flow after applying a patterned stack etch through the plurality of layers. A layer of photoresist (not shown) or other mask material is formed on the layer 205, and patterned to form the mask. Next, a stack etch is applied using the mask etching in one or more etch steps, through the layers 205, 206, 207 and 201, to form a plurality of stacks, including stacks 230, 231, 232, and 233. The bottom layer in each of the plurality of stacks includes a first conductor having a width in this example ranging from about 10 nm to about 40 nm, preferably 20 nm.

Figure 4:
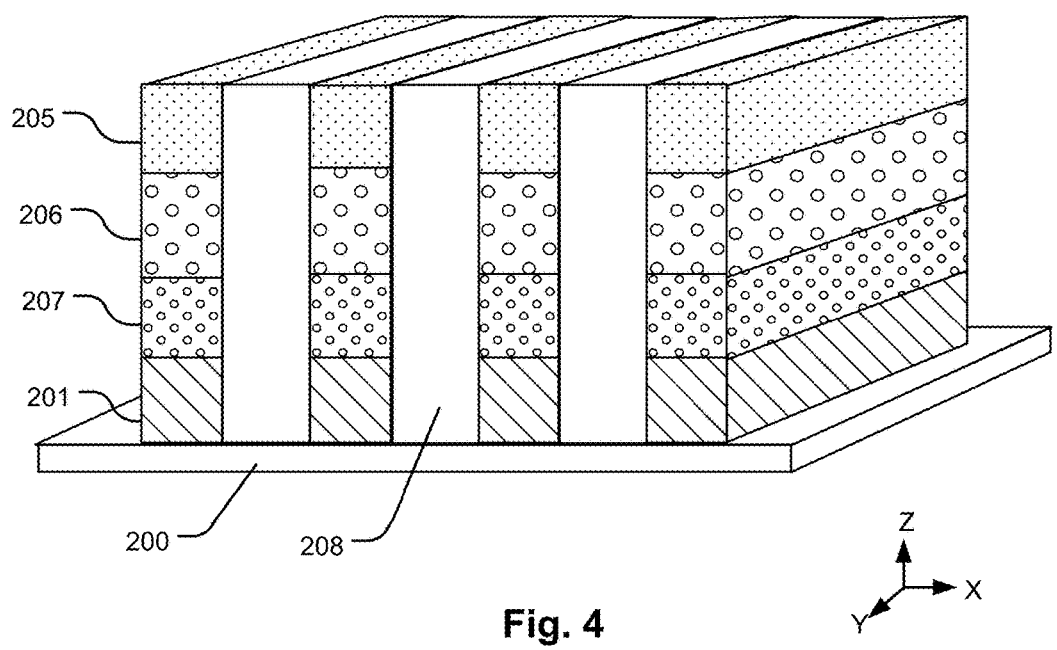

FIG. 4 illustrates a stage of the process flow after formation of a dielectric fill 208 between the stacks. A spin-on dielectric comprising silicon oxide, for example, can be used to form the dielectric fill between the stacks, and then a process is applied to planarize and expose the tops of the stacks, such as a chemical mechanical polishing CMP. The dielectric fill 208 can also be formed using chemical vapor deposition (CVD), atomic layer deposition (ALD), physical vapor deposition (PVD), low-pressure chemical vapor deposition (LPCVD), or high density plasma chemical vapor deposition (HDPCVD).

Figure 5:
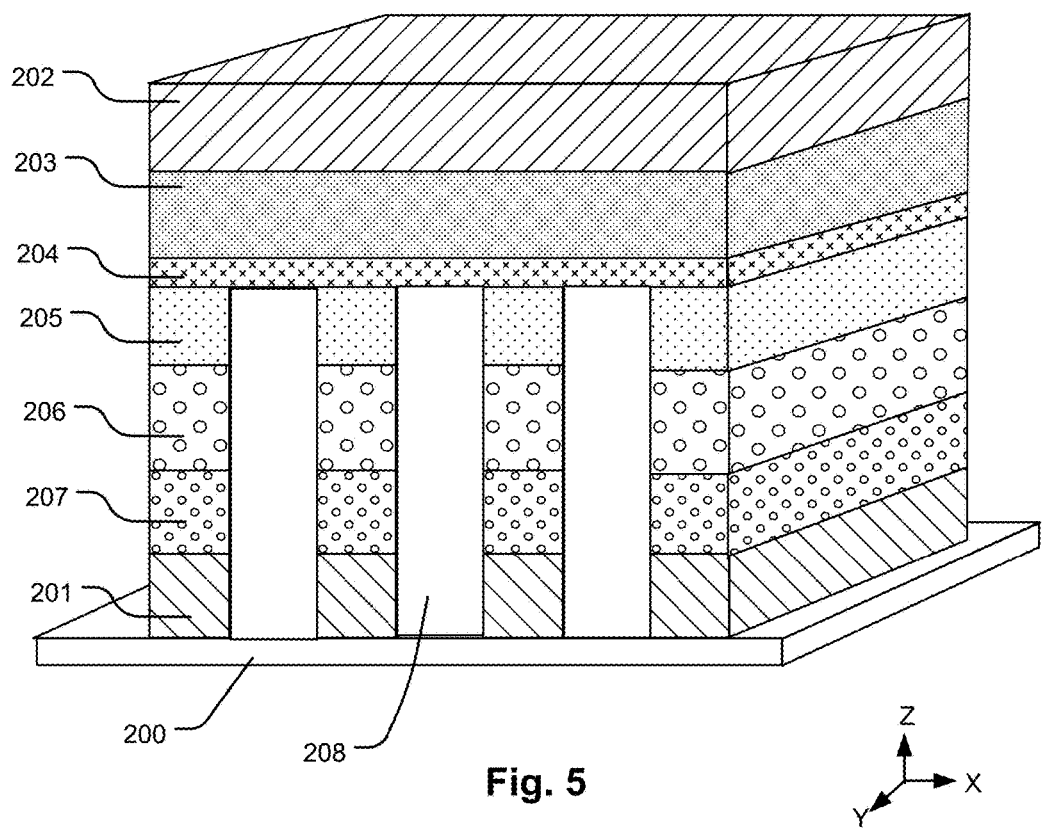

FIG. 5 illustrates a stage of the process flow after formation of a plurality of layers on the stacks. The plurality of layers added to form the structure of FIG. 5 includes diffusion barrier layer 204, switching layer 203, and second conductor layer 202 sequentially deposited over the stacks using deposition techniques such as CVD, PVD, and ALD.

Figure 6:
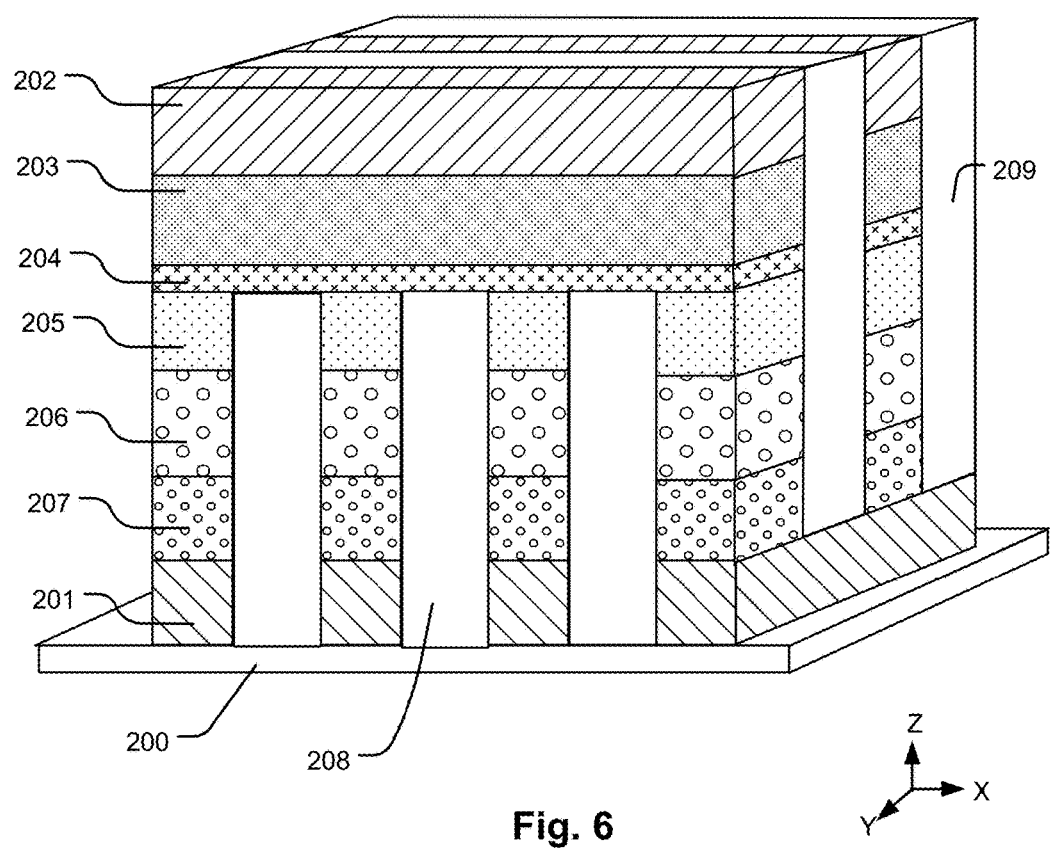

FIG. 6 illustrates a stage of completion of the first level of memory cells in the memory array. To form the structure of FIG. 6, a stack etch is applied to the structure of FIG. 5, stopping at the first conductor layer 201, and thereby forming pillars including remaining portions of the layers 205, 206 and 207. The stack etch can be performed using an etch mask comprising photoresist, or other materials, such as a hardmask, or a combination of photoresist and hardmask. Examples of hardmask materials may comprise silicon nitride, titanium nitride, bottom anti-reflective coating (BARC), top anti-reflective coating (TARC), and other materials. After forming the mask, a stack etch is applied using one or more etch steps, stopping on or without cutting through the first conductor layer 201.

Next, a fill step is applied to fill the trenches with a dielectric fill 209, such as silicon oxide and silicon nitride, and followed by a CMP process. The fill step can be implemented using a spin-on process, CVD, ALD, PVD, LPCVD, and HDPCVD for example. The combination of the fill 209 and the fill 208 form a structure that physically confines the pillar including the layer 206 of phase change material.

The resulting structure as shown in FIG. 6 comprises the first level of the memory cells disposed at cross points between the first conductors in the first patterned layer (201) and the second conductors in the second patterned layer (202). Each of the pillars including phase change material is surrounded and confined by the dielectric fill (208, 209). An active region in phase change layer 206 in the pillar changes solid phase during operations. In this example, the primary current flow is from the first conductor (positive node) to the second conductor (negative node or less positive node). The first element, such as Te, can be present in the pillar, such that the pillar has a gradient in concentration of the first element increasing along a line from the active region to the first side of the pillar, having a maximum concentration for example in the first buffer layer 205 at the first side of the pillar distal to the first conductor, and proximal to the second conductor. On the other hand, the second element, such as Sb, can be present in the pillar such that there is a gradient in concentration of the second element increasing along a line from the active region to the second side of the pillar, having a maximum concentration for example in the second buffer layer 207 at the second side of the pillar proximal to the first conductor. Thus, first buffer layer 205 can be a Te-rich phase change material for example and include a higher concentration of the first element than the active region, and second buffer layer 207 can be an Sb-rich phase change material and include a higher concentration of the second element than the active region. The first buffer layer 205 can be a Te-rich phase change material for example and include a higher concentration of the Te than the second buffer layer 207. Also, the second buffer layer 207 can be an Sb-rich phase change material and include a higher concentration of the Sb than the first buffer layer 205. The first and second buffer layers may act as sinks or sources of elements of the phase change material such that segregation and void formation in the active region can be diminished so as to improve endurance.

Figure 7:
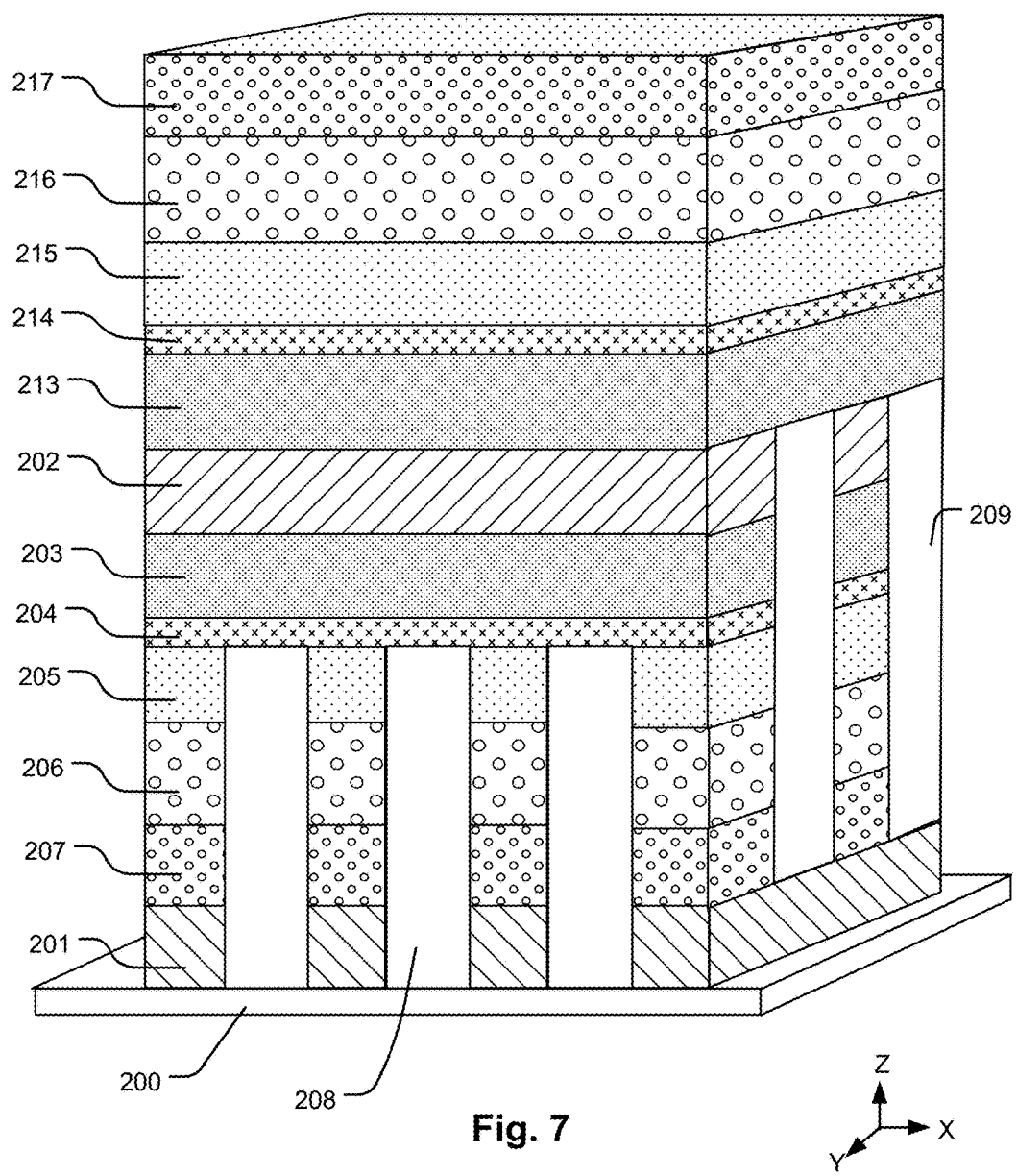

FIG. 7 illustrates a stage of the process flow after forming a plurality of layers used for formation of the second level of the memory array. A second switching layer 213, second diffusion barrier layer 214, a second layer 215 of material suitable for the first buffer layer, a second layer 216 of phase change material suitable for the active region, and a second layer 217 of material suitable for the second buffer layer are sequentially deposited over the first level of memory array.

Figure 8:
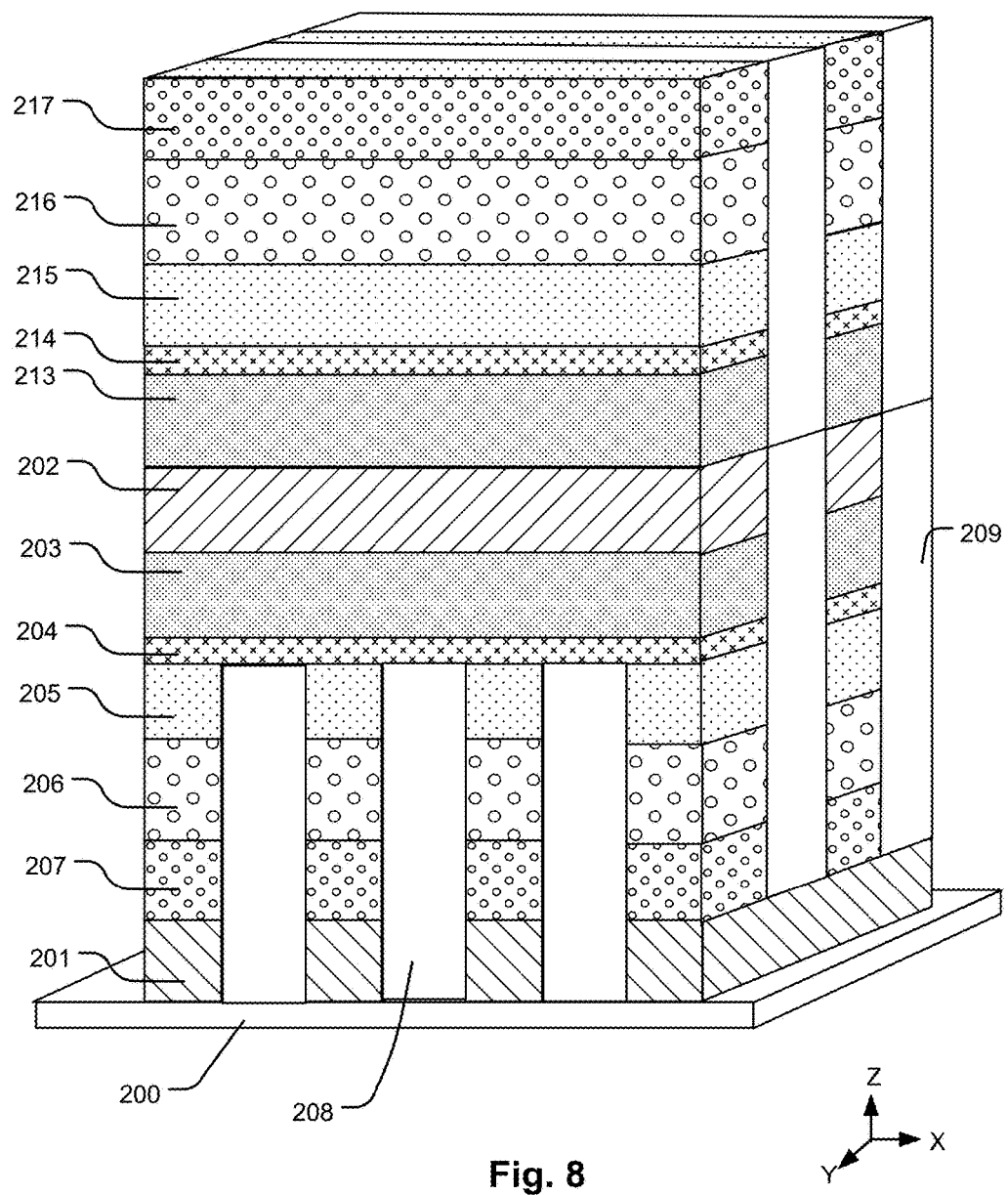

FIG. 8 illustrates a stage of the process flow after applying a first stack etch and a first fill step to the second level in the memory array. The first stack etch is applied using a mask to etch the second conductor layer (e.g. 202), stopping at dielectric fill 209. Next, a dielectric fill is formed in the gaps between the stacks, and followed by a CMP process.

Figure 9:
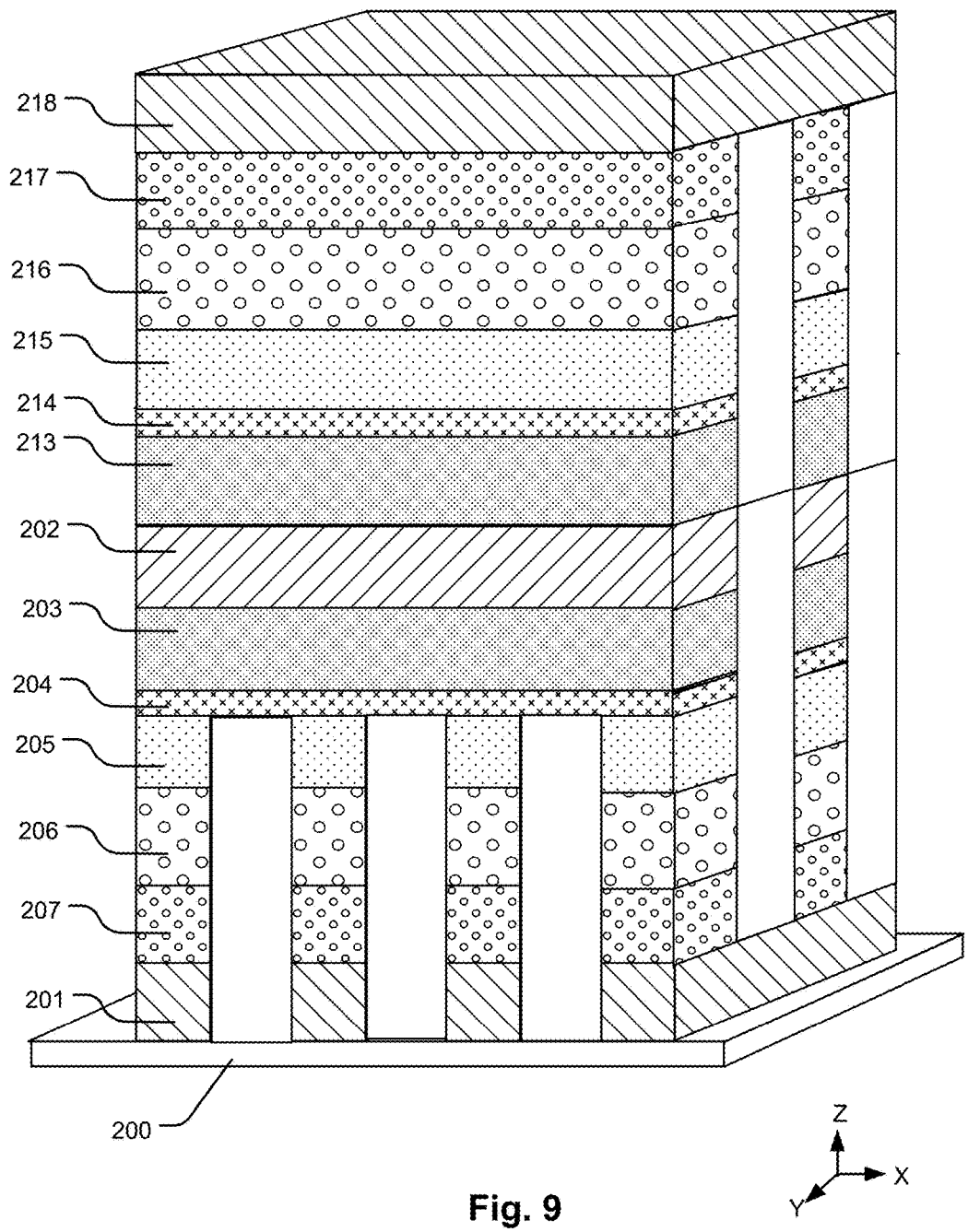

FIG. 9 illustrates a stage of the process flow after depositing a second layer of first conductors. A third conductor layer 218 suitable for bit lines is formed over the structure of FIG. 8 using for example one or more of CVD, PVD, and ALD processes.

Figure 10:
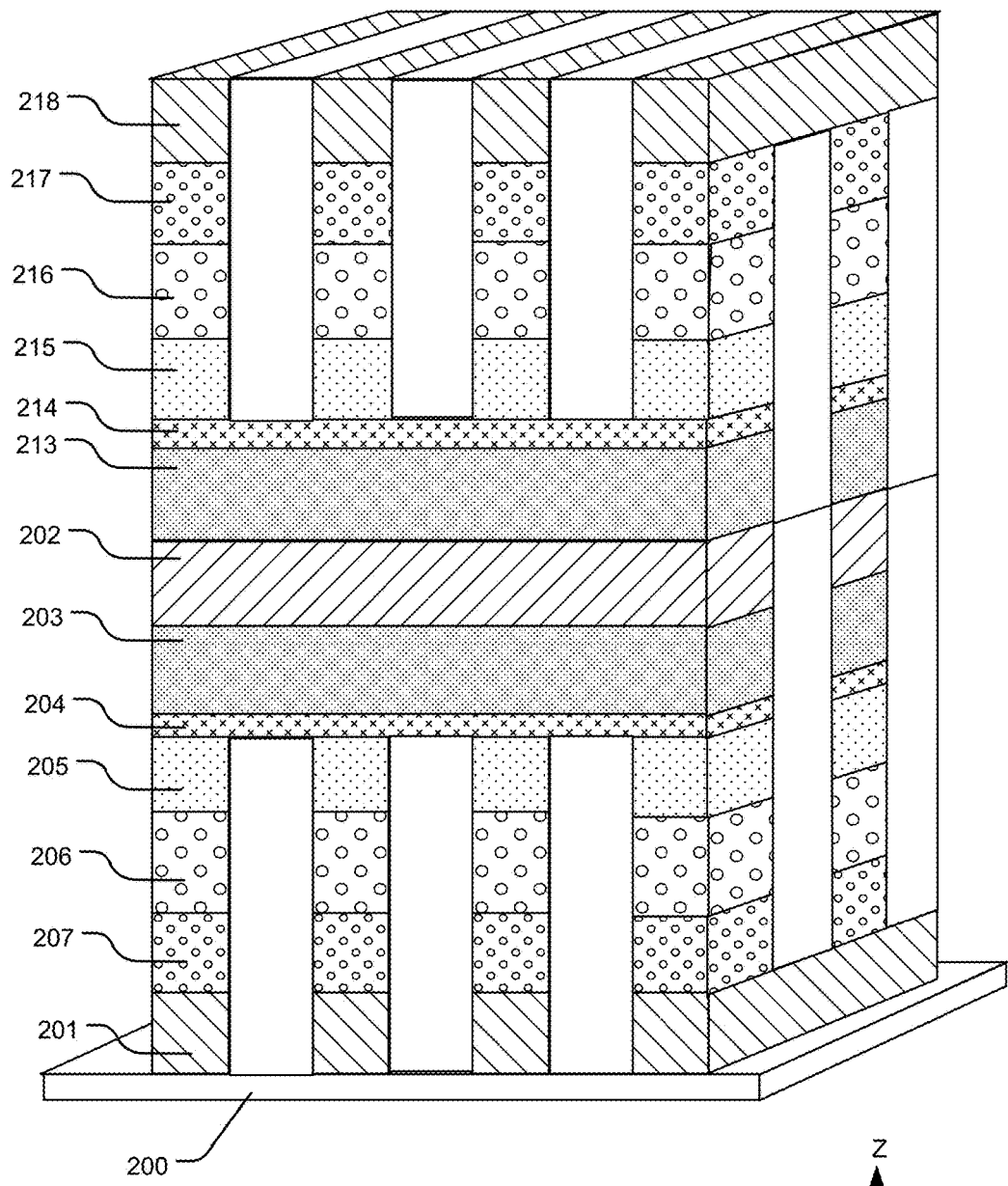

FIG. 10 illustrates a stage of the process flow after applying a second stack etch and a second fill step to the second level in the memory array. The second stack etch is applied using a mask in one or more etch steps to etch the first conductor layer (e.g. 201), stopping at diffusion barrier layer 214. Next, a dielectric fill is formed in the gaps between the stacks, and followed by a CMP process. Then a plurality of pillars of phase change material in the second level is confined by the dielectric material.

In the illustrated process flow, the stack etch is applied twice in each level. One stack etch is applied to form stacks along the first conductor direction, the other is applied to form stacks along the second conductor direction.

Alternatively, the second stack etch in the first level can be combined with the first stack etch in the second level so as to reduce the process steps and lower the cost.

In this embodiment, the plurality of conductors in second conductor layer 202 is shared by the first level and the second level in the memory array. During operations of memory cells in the second level, a primary current flow is from the conductor in third conductor layer 218 (positive node) to the conductor in second conductor layer 202 (negative node or less positive node). First buffer layer 215 in the pillar in the second level, proximal to second conductor layer 202, comprises a Te-rich material, such as a Te-rich phase change material having a higher concentration of Te than an active region in phase change layer 216. Also, second buffer layer 217 in the pillar in the second level, distal to second conductor layer 202, comprises an Sb-rich material, such as an Sb-rich phase change material having a higher concentration of Sb than an active region in phase change layer 216.

In another example, during operations of memory cells in the second level, a primary current flow is from second conductor layer 202 (positive node) to third conductor layer 218 (negative node or less positive node), and during operations of memory cells in the first level, a primary current flow is from first conductor layer 201 (positive node) to second conductor layer 202 (negative node or less positive node). So the second conductor in second conductor layer 202 acts as a top electrode in the first level but acts as a bottom electrode in the second level. As such, first buffer layer 205 in the first level of the memory array comprises a Te-rich phase change material, and first buffer layer 215 in the second level of the memory array comprises an Sb-rich phase change material. On the other hand, second buffer layer 207 in the first level of the memory array comprises an Sb-rich phase change material, and second buffer layer 217 in the second level of the memory array comprises a Te-rich phase change material.

A third level, or more levels, can be formed by repeating the steps as described above.

Figure 11:
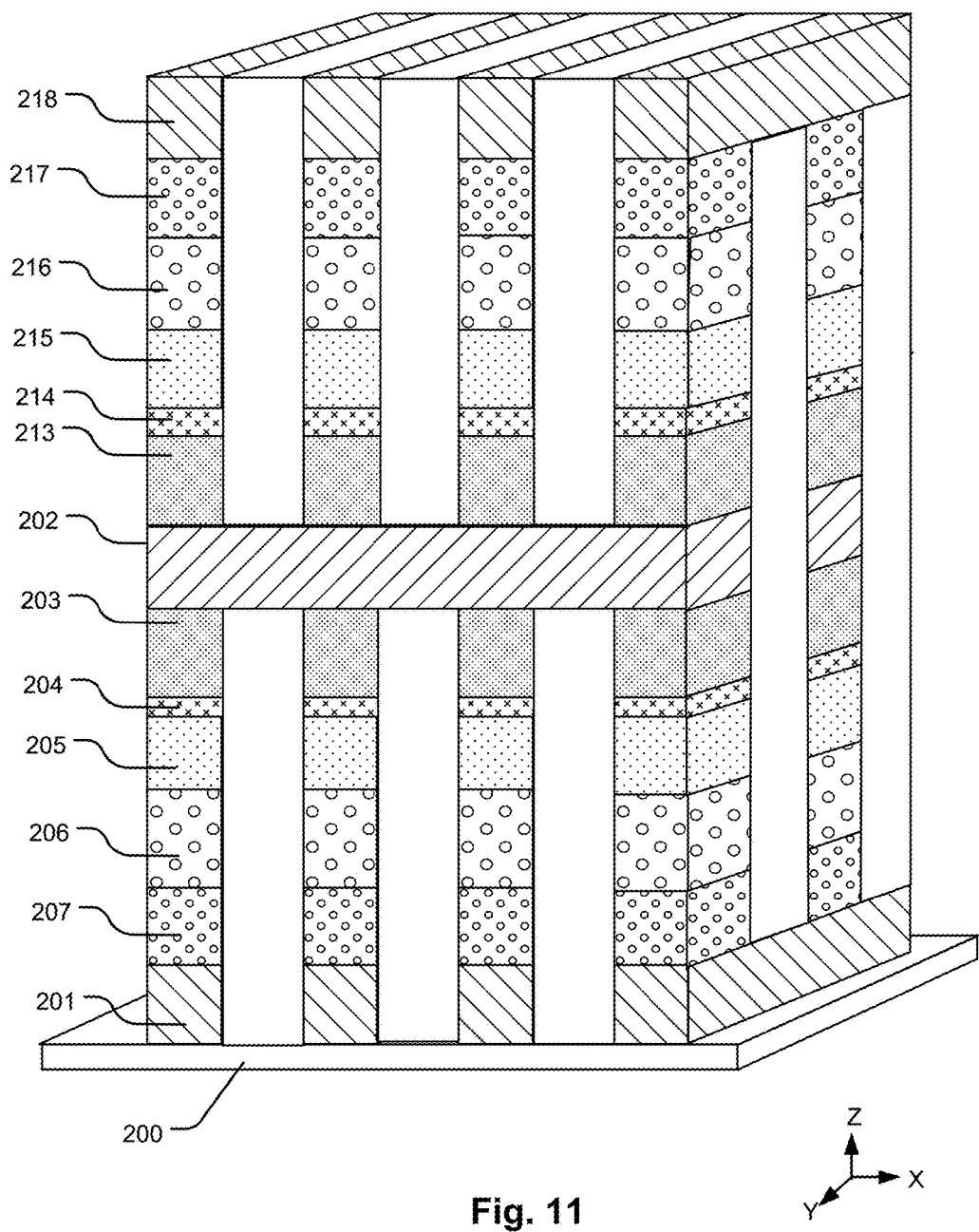
FIG. 11 illustrates a variant of the array shown in FIG. 10.

FIG. 11 illustrates a variant of the structure of FIG. 10. The structure of FIG. 11 is different from the structure of FIG. 10 in that the switching layer (e.g. 203, 213) and the diffusion barrier layer (e.g. 204, 214) are aligned with the pillar of phase change material.

Figure 12:
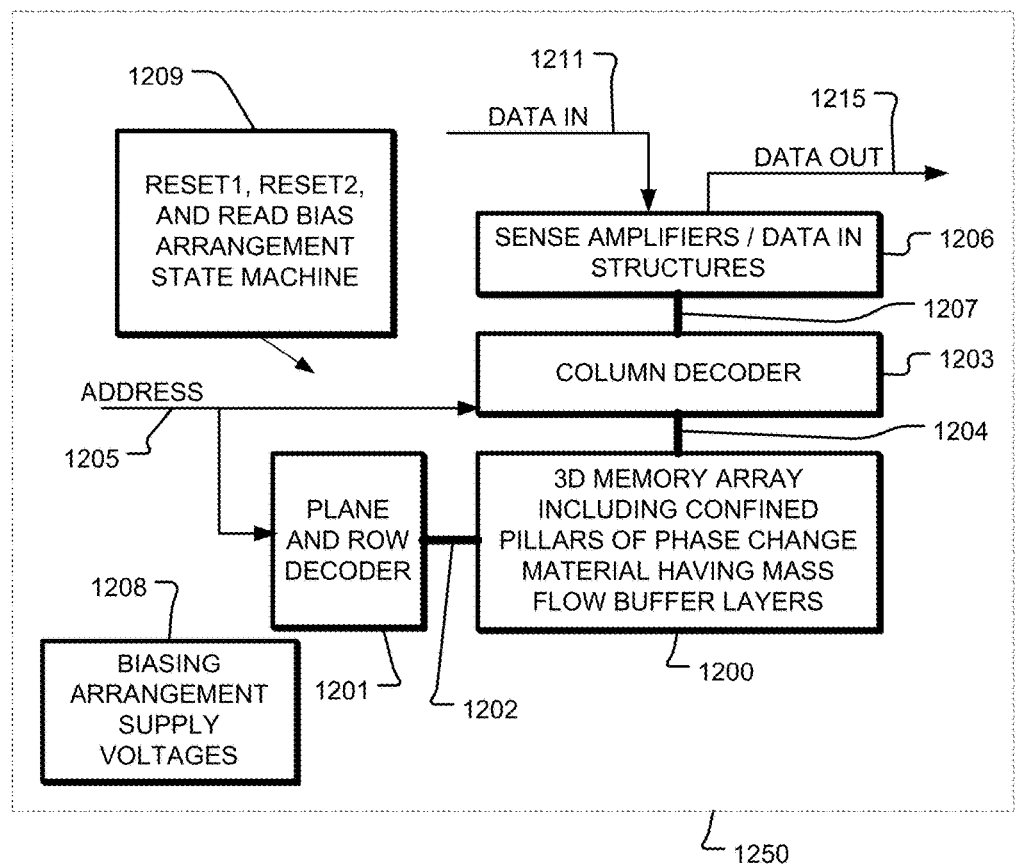

FIG. 12 shows an integrated circuit 1250 including a 3D memory array 1200 comprising memory cells including ovonic threshold switches in series with confined pillars of phase change material having mass flow buffer layers. A plane and row decoder 1201 is coupled to, and in electrical communication with, a plurality of word lines 1202, and arranged along rows in the memory array 1200. A column decoder 1203 is coupled to and in electrical communication with, a plurality of bit lines 1204 arranged along columns in the memory array 1200 for reading data from, and writing data to, the memory cells in the 3D memory array 1200. Addresses are supplied on bus 1205 to the plane and row decoder 1201 and to the column decoder 1203. Sense amplifiers and other supporting circuitry such as pre-charge circuits and so on, along with data-in structures in block 1206, are coupled to the column decoder 1203 via the bus 1207. Data is supplied via the data-in line 1211 from input/output ports on the integrated circuit 1250 or other data sources, to the data-in structures in block 1206. Data is supplied via the data-out line 1215 from the sense amplifiers in block 1206 to input/output ports on the integrated circuit 1250, or to other data destinations internal or external to the integrated circuit 1250. A bias arrangement state machine is in circuitry 1209, controlling biasing arrangement supply voltages 1208, and the sense circuitry and the data-in structures in block 1206, for read and write operations. The circuitry can be implemented using special purpose logic, a general purpose processor or a combination thereof, configured to execute the read, write and erase operations.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. An integrated circuit, comprising:
    a plurality of first conductors in a first patterned layer and a plurality of second conductors in a second patterned layer;
    a first array of memory cells disposed between the first conductors and the second conductors;
    a plurality of third conductors in a third patterned layer;
    a second array of memory cells disposed between the second conductors and the third conductors;
    each memory cell in the first array and in the second array comprising:
        a switch in series with a body of phase change material having an active region including first and second elements;
        a first buffer layer disposed in series between the active region and the switch, and including a higher concentration of the first element than the active region; and
        a second buffer layer disposed in series between the active region and the one of the first and second conductors disposed distal to the switch, and including a higher concentration of the second element than the active region.

2. The integrated circuit of claim 1, wherein one of the first element and second element is antimony Sb, and another of the first element and the second element is tellurium Te.

3. The integrated circuit of claim 1, wherein one of the first element and second element is antimony Sb, and another of the first element and the second element is tellurium Te, and the phase change material comprises $Ga_xSb_yTe_z$.

4. The integrated circuit of claim 1, wherein one of the first element and second element is antimony Sb, and another of the first element and the second element is tellurium Te, and the phase change material comprises $Ge_xSb_yTe_z$.

5. The integrated circuit of claim 1, wherein one of the first element and second element is antimony Sb, and another of the first element and the second element is tellurium Te, and the phase change material comprises $Ga_wGe_xSb_yTe_z$.

6. The integrated circuit of claim 4, wherein the first buffer layer includes Te-rich $Ge_xSb_yTe_z$, and the first element is Te, and the second buffer layer includes Sb-rich $Ge_xSb_yTe_z$, and the second element is Sb.

7. The integrated circuit of claim 1, wherein the phase change material comprises dielectric additive.

8. The integrated circuit of claim 1, wherein the body of phase change material in the memory cells of the first array is confined by dielectric fill material between the first and second patterned layers, and the body of phase change material in the memory cells of the second array is confined by dielectric fill material between the third and second patterned layers.

9. The integrated circuit of claim 1, wherein the switch is an ovonic threshold switch.

10. The integrated circuit of claim 1, wherein the plurality of first conductors, the plurality of second conductors and the plurality of third conductors are arranged in a stacked cross-point configuration, with the first and second arrays of memory cells at cross-points.

11. A method of manufacturing an integrated circuit, comprising:
    forming a plurality of first conductors in a first patterned layer and a plurality of second conductors in a second patterned layer; and
    forming a first array of memory cells disposed between the first conductors and the second conductors;
    forming a plurality of third conductors in a third patterned layer;
    forming a second array of memory cells disposed between the second conductors and the third conductors;
    each memory cell in the first array and in the second array comprising:
        a switch in series with a body of phase change material having an active region including first and second elements;
        a first buffer layer disposed in series between the active region and the switch, and including a higher concentration of the first element than the active region; and
        a second buffer layer disposed in series between the active region and the one of the first and second conductors disposed distal to the switch, and including a higher concentration of the second element than the active region.

12. The method of claim 11, wherein one of the first element and second element is antimony Sb, and another of the first element and the second element is tellurium Te.

13. The method of claim 11, wherein one of the first element and second element is antimony Sb, and another of the first element and the second element is tellurium Te, and the phase change material comprises $Ga_xSb_yTe_z$.

14. The method of claim 11, wherein one of the first element and second element is antimony Sb, and another of the first element and the second element is tellurium Te, and the phase change material comprises $Ge_xSb_yTe_z$.

15. The method of claim 11, wherein the first buffer layer includes Te-rich $Ge_xSb_yTe_z$, and the first element is Te, and the second buffer layer includes Sb-rich $Ge_xSb_yTe_z$, and the second element is Sb.

16. The method of claim 11, wherein said forming the array of memory cells includes using an etch mask of formation of the plurality of first conductors and using an etch mask of formation the plurality of second conductors.

17. An integrated circuit, comprising:
    a first conductor, a second conductor and a third conductor;
    a first memory cell disposed between the first and second conductors;
    a second memory cell disposed between the second and third conductors;
    the first memory cell and the second memory cell each including an ovonic switch in series with a confined pillar including a body of phase change material comprising Sb and Te, the body having a first side proximal to the second conductor and a second side distal to the second conductor, the body having an active region, a first region in mass flow communication with the active region having a maximum concentration of Te on the first side proximal to the second conductor, and having a second region in mass flow communication with the active region having a maximum concentration of Sb on the second side distal to the second conductor.

18. The integrated circuit of claim 17, further comprising a diffusion barrier between the ovonic switch and the pillar.

19. The integrated circuit of claim 17, wherein the phase change material comprises a dielectric additive.

20. The integrated circuit of claim 17, wherein the pillar comprises an active region between the first side and the second side.

* * * * *